(12) United States Patent
Han et al.

(10) Patent No.: US 10,693,087 B2
(45) Date of Patent: Jun. 23, 2020

(54) DISPLAY PANEL WITH A METAL WIRE ARRAY DISPOSED ON THE BENDING REGION OF A FLEXIBLE SUBSTRATE

(71) Applicant: Shenzhen China Star Optoelectronics Semiconductor Display Technology Co., Ltd., Shenzhen, Guangdong (CN)

(72) Inventors: Baixiang Han, Guangdong (CN); Yuan-chun Wu, Guangdong (CN); Po-Yen Lu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 143 days.

(21) Appl. No.: 15/739,026

(22) PCT Filed: Jul. 10, 2017

(86) PCT No.: PCT/CN2017/092356
§ 371 (c)(1),
(2) Date: Dec. 21, 2017

(87) PCT Pub. No.: WO2018/232792
PCT Pub. Date: Dec. 27, 2018

(65) Prior Publication Data
US 2018/0375041 A1    Dec. 27, 2018

(30) Foreign Application Priority Data
Jun. 23, 2017   (CN) .......................... 2017 1 0487257

(51) Int. Cl.
*H01L 29/08*        (2006.01)
*H01L 33/00*        (2010.01)
(Continued)

(52) U.S. Cl.
CPC ........ *H01L 51/0097* (2013.01); *H01L 27/322* (2013.01); *H01L 27/3276* (2013.01);
(Continued)

(58) Field of Classification Search
CPC ... H01L 51/0097; H01L 51/003; H01L 51/56; H01L 27/322; H01L 27/3276;
(Continued)

(56) References Cited

U.S. PATENT DOCUMENTS 9,214,640 B2 * 12/2015  Lee ..................... H01L 51/0097
9,652,096 B2 *  5/2017  Martisauskas ........ G06F 1/1643
(Continued)

FOREIGN PATENT DOCUMENTS

CN          102568377 A     7/2012
CN          103646611 A     3/2014
(Continued)

*Primary Examiner* — Alonzo Chambliss
(74) *Attorney, Agent, or Firm* — Nelson Mullins Riley & Scarborough LLP; Kongsik Kim, Esq.

(57) ABSTRACT

The present disclosure provides a display panel. The display panel has a display region and a packaging region disposed outside the display region, and includes an array substrate including a glass substrate, a flexible substrate disposed on the glass substrate, and a scanning line and a data lines disposed on the flexible substrate, a bending region extending outside the packaging region is disposed outside the packaging region at at least one side of the flexible substrate, a metal wire array used for connecting the scanning line and the data line of the array substrate to row driving and column driving chips is disposed in the bending region on the flexible substrate, and the bending region is bent toward a side surface of the flexible substrate deviating from the scanning line.

20 Claims, 9 Drawing Sheets

(51) Int. Cl.
*H01L 31/0203* (2014.01)
*H01L 21/00* (2006.01)
*H01L 51/40* (2006.01)
*H01L 51/00* (2006.01)
*H01L 27/32* (2006.01)
*H01L 51/56* (2006.01)
*B23K 101/36* (2006.01)
*B23K 26/38* (2014.01)

(52) U.S. Cl.
CPC ............ *H01L 51/003* (2013.01); *H01L 51/56* (2013.01); *B23K 26/38* (2013.01); *B23K 2101/36* (2018.08); *H01L 2227/326* (2013.01); *H01L 2251/5315* (2013.01); *H01L 2251/5338* (2013.01)

(58) Field of Classification Search
CPC ............... H01L 27/3244; H01L 27/124; H01L 23/4985; H01L 27/1322
See application file for complete search history.

(56) References Cited

U.S. PATENT DOCUMENTS

| | | | | |
|---|---|---|---|---|
| 10,172,233 B2 * | 1/2019 | Chung | ................... | H05K 1/028 |
| 2014/0042406 A1 * | 2/2014 | Degner | ................ | H01L 27/326 257/40 |
| 2014/0092338 A1 * | 4/2014 | Miyazaki | ............ | G02F 1/13452 349/58 |
| 2014/0183473 A1 * | 7/2014 | Lee | .................... | H01L 51/0097 257/40 |
| 2015/0115274 A1 * | 4/2015 | Furuie | ................. | H01L 27/3276 257/72 |
| 2015/0187279 A1 * | 7/2015 | Lee | ..................... | G09G 3/3225 257/40 |
| 2015/0263300 A1 * | 9/2015 | Namkung | ........... | H01L 51/0097 257/40 |
| 2016/0087024 A1 * | 3/2016 | Son | ..................... | H01L 27/3276 257/40 |
| 2016/0093644 A1 * | 3/2016 | Ki | ..................... | H01L 29/78672 257/40 |
| 2016/0093683 A1 * | 3/2016 | Lee | ..................... | H01L 51/0097 257/40 |
| 2016/0093685 A1 * | 3/2016 | Kwon | ................. | H01L 51/5237 257/40 |
| 2016/0155788 A1 * | 6/2016 | Kwon | ................. | H01L 27/3276 257/40 |
| 2016/0172428 A1 * | 6/2016 | Song | ................... | H01L 51/0097 257/99 |
| 2016/0172623 A1 * | 6/2016 | Lee | ..................... | H01L 51/5253 257/40 |
| 2016/0181345 A1 * | 6/2016 | Lee | ..................... | H01L 27/3276 257/40 |
| 2016/0190522 A1 * | 6/2016 | Lee | ..................... | H01L 51/0097 257/40 |
| 2017/0237027 A1 * | 8/2017 | Lee | ..................... | H01L 51/0097 257/40 |

FOREIGN PATENT DOCUMENTS

| | | |
|---|---|---|
| CN | 103985371 A | 8/2014 |
| CN | 104103669 A | 10/2014 |
| CN | 104752485 A | 7/2015 |
| CN | 104885140 A | 9/2015 |
| CN | 105977400 A | 9/2016 |
| KR | 20140064156 A | 5/2014 |

* cited by examiner ical field, especially a display panel used for an active matrix organic light emitting diode.

DISPLAY PANEL WITH A METAL WIRE ARRAY DISPOSED ON THE BENDING REGION OF A FLEXIBLE SUBSTRATE

CROSS-REFERENCES TO RELATED APPLICATIONS

This application is a U.S. national phase application, pursuant to 35 U.S.C. § 371, of PCT/CN2017/092356, filed Jul. 10, 2017, designating the United States, which claims priority to Chinese Application No. 201710487257.8, filed Jun. 23, 2017. The entire contents of the aforementioned patent applications are incorporated herein by this reference.

TECHNICAL FIELD

The present disclosure relates to an organic light emitting device technology, especially a display panel used for an active matrix organic light emitting diode.

BACKGROUND ART

With the continuous development of display technology, people's demand for an ultra-narrow bezel display screen becomes increasingly stronger. In comparison with LCD (Liquid Crystal Display) panel, the display panel technology of AMOLED (Active-matrix organic light emitting diode) is more suitable for an ultra-narrow bezel design, and how a display panel bezel can be reduced to the maximum extent becomes a direction of research in the current industry.

SUMMARY

In order to overcome the defects of the prior art, the present disclosure provides a display panel to realize an ultra-narrow bezel structure of the display panel.

The present disclosure provides a display panel. The display panel has a display region and a packaging region disposed outside the display region, and includes an array substrate including a glass substrate, a flexible substrate disposed on the glass substrate, and a scanning line and a data line disposed on the flexible substrate, a bending region extending outside the packaging region is disposed outside the packaging region at at least one side of the flexible substrate, a metal wire array used for connecting the scanning line and the data line of the array substrate to row driving and column driving chips is disposed in the bending region on the flexible substrate, and the bending region is bent toward a side surface of the flexible substrate deviating from the scanning line.

Furthermore, the metal wire array includes row metal wires connecting the scanning line of the array substrate to the row driving chip and column metal wires connecting the data line of the array substrate to the column driving chip.

Furthermore, the array substrate further includes a flexible buffer layer covering the metal wires, and the scanning line and the data line are disposed on the flexible buffer layer.

Furthermore, the row metal wires and the column metal wires are disposed on a same layer.

Furthermore, the part of glass substrate in the bending region on the glass substrate is stripped off the flexible substrate after being cut by laser cutting, so that the bending region is bent toward the side surface of the flexible substrate deviating from the scanning line and is bonded to a corresponding side of the glass substrate.

Furthermore, the glass substrate is completely stripped off the flexible substrate by laser stripping, so that the bending region is bent toward the side surface of the flexible substrate deviating from the scanning line and is bonded to the side surface of the flexible substrate deviating from the scanning line.

Furthermore, a bending region extending outside the packaging region is disposed outside the packaging region at a lower side of the flexible substrate.

Furthermore, the bending region extending outside the packaging region is disposed on the packaging region at left and right sides and the lower side of the flexible substrate, the metal wire array connects the scanning line of the array substrate with the row driving chip on the bending region at left and right sides of the flexible substrate, and the connects the data line of the array substrate with the column driving chip metal wire array on the bending region at the lower side of the flexible substrate.

Furthermore, the display panel further includes a color filter substrate disposed opposite to the array substrate.

Compared with the prior art, it is realized that the metal wire array is hidden in the sides of the glass substrate or one side surface of the flexible substrate deviating from the scanning line through bending in the present disclosure by disposing the flexible substrate on the glass substrate and disposing the bending region having a metal wire array on the flexible substrate, so that the width of the packaging region is reduced and the size of the bezel is reduced to the maximum extent.

DETAILED DESCRIPTION OF EXEMPLARY EMBODIMENTS

Below, the present disclosure is explained in further detail in comparison with the figures and embodiments.

The improvement made on an array substrate in a display panel of the present disclosure only lies in adding a flexible substrate, a metal wire array, and a flexible buffer layer, the other structures such as a scanning line, a data line, an active layer, a source electrode, a drain electrode and so on are not changed. The parts without change are not described herein any more. The present disclosure is suitable for an AMOLED display panel, especially for an AMOLED top emission structure.

Figure 1A:
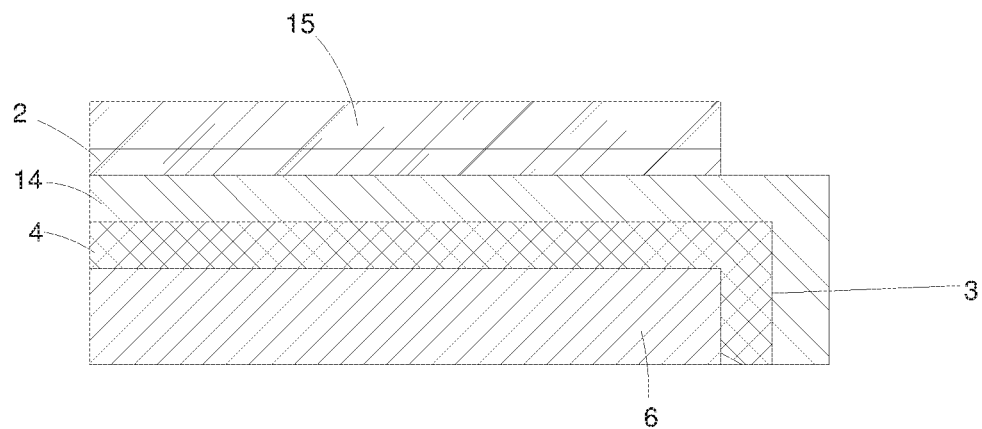
FIG. 1A is a schematic view of a bended structure of embodiment 1 of the present disclosure.
Figure 1B:
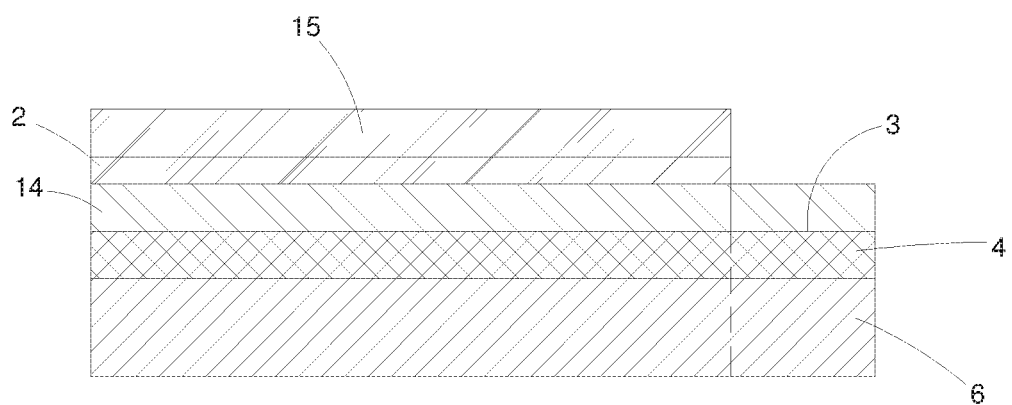
FIG. 1B is a schematic view of a glass substrate of a bending region before cutting of embodiment 1 of the present disclosure.
Figure 1C:
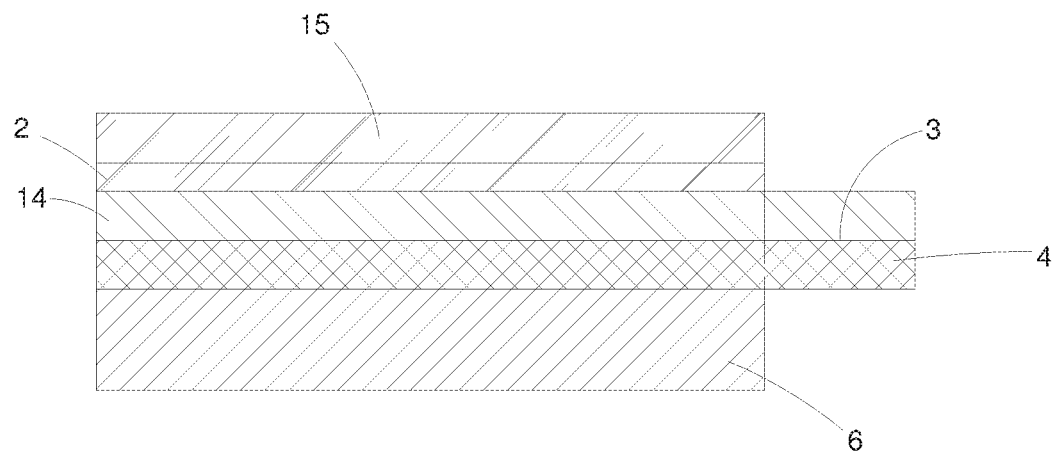
FIG. 1C is a schematic view of a glass substrate of a bending region after cutting of embodiment 1 of the present disclosure.
Figure 1D:
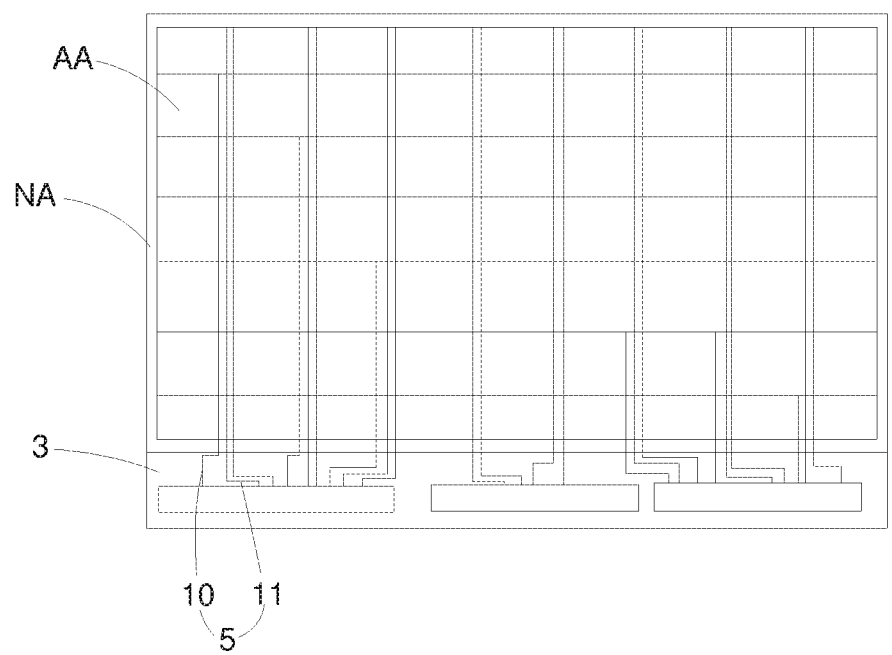
FIG. 1D is an extended schematic view of embodiment 1 of the present disclosure.
Figure 1E:
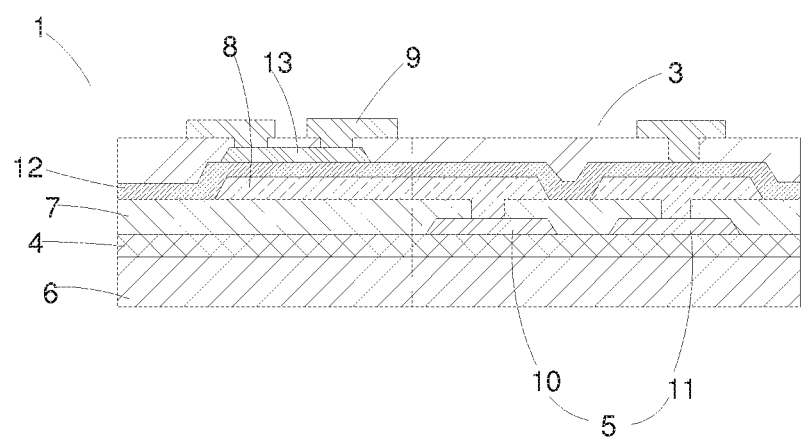
FIG. 1E is a structural schematic view of a bending region in an array substrate of the present disclosure.

As shown in FIGS. 1A and 1E, a display panel of the present disclosure has a display region AA and a packaging region NA disposed outside the display region. The display region includes an array substrate 1 including at least display device layers such as a glass substrate 6, a flexible substrate 4 disposed on the glass substrate 6, and a scanning line 8 and a data line 9 disposed on the flexible substrate 4 and so on, a bending region 3 extending outside the packaging region is disposed outside the packaging region at at least one side of the flexible substrate 4, a metal wire array 5 used for connecting the scanning line 8 and the data line 9 of the array substrate 1 to row driving and column driving chips is disposed in the bending region 3 on the flexible substrate 4, and the bending region 3 is bent toward a side surface of the flexible substrate 4 deviating from the scanning line 8, so as to realize a reduction in the width of the packaging region and transfer the metal wire array 5 to sides of the glass substrate 6 or one side surface of the flexible substrate 4 deviating from the scanning line 8.

A color filter substrate 2 is disposed on the array substrate 1 opposite to each other, and the color filter substrate 2 may be a filter structure having a RGB color resistance.

FIG. 1E only lists main components to realize the present disclosure. It can be seen from FIG. 1E that a flexible buffer layer 7 is disposed on the flexible substrate 4, the flexible buffer layer 7 is used for filling up the surface of the flexible substrate 4 and cover the metal wires 5, and the scanning line 8 and the data line 9 are disposed on the flexible buffer layer 7. It should be noted that, display device layers 14 such as the scanning line 8, the data line 9, a gate insulating layer 12, an active layer 13, source and drain electrodes (not shown in the figure), a semiconductor layer (not shown in the figure), an anode (not shown in the figure), an organic light emitting layer (not shown in the figure), a cathode (not shown in the figure) and so on are all realized according to the manufacturing method and structure of the prior art, which are not specifically defined herein, and it only needs to connect the metal wire array 5 with the scanning line 8 and the data line 9 through lapping.

As shown in FIG. 1E, the metal wire array 5 includes row metal wires 10 connecting the scanning line 8 of the array substrate 1 to the row driving chip and column metal wires 11 connecting the data line 9 of the array substrate 1 to the column driving chip; and the row metal wires 10 and the column metal wires 11 are disposed on the same layer.

As shown in FIGS. 1A, 1B, 1C and 1D, in the display panel of embodiment 1 of the present disclosure, during the manufacturing, the glass substrate 6 has the same area as that of the flexible substrate 4, the flexible substrate 4 includes the display region, the packaging region and the bending region 3, the bending region 3 is disposed outside the packaging region at the lower side of the flexible substrate 4 and extends outside the packaging region, the row metal wires 10 and the column metal wires 11 are both disposed on the lower bending region 3, the row metal wires 10 connect the scanning line 8 of the array substrate 1 to the row driving chip, and the column metal wires 11 connect the data line 9 of the array substrate 1 to the column driving chip; a cover plate or film 15 is disposed on the display surface of the display panel on the display region and the packaging region of the display panel, for protection; and after the display panel is completely manufactured, the part of glass substrate in the bending region 3 on the glass substrate 6 is cut by laser (as shown in FIG. 1B), after the redundant glass substrate in the bending region 3 is cut off (as shown in FIG. 1C), the bending region 3 is bent, so that the bending region 3 is bent toward a side surface of the flexible substrate 4 deviating from the scanning line 8 and is finally bonded to a corresponding side of the glass substrate 6.

Figure 2A:
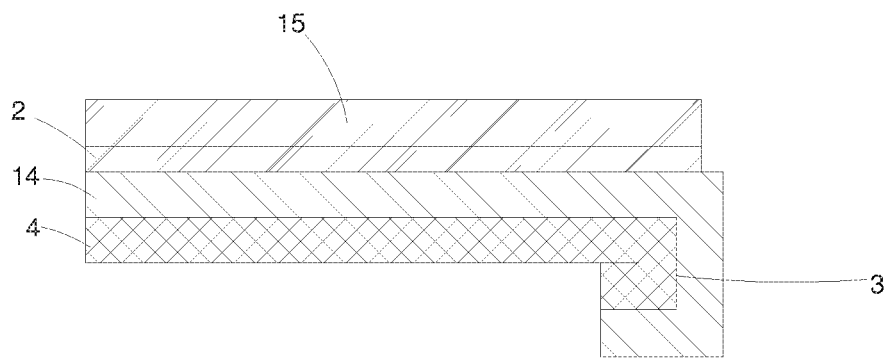
FIG. 2A is a schematic view of a bended structure of embodiment 2 of the present disclosure.
Figure 2B:
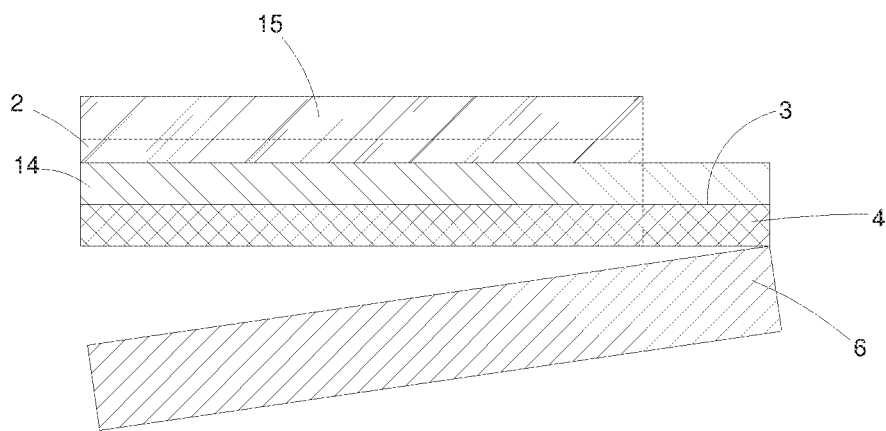
FIG. 2B is a schematic view of a glass substrate before stripping of embodiment 2 of the present disclosure.
Figure 2C:
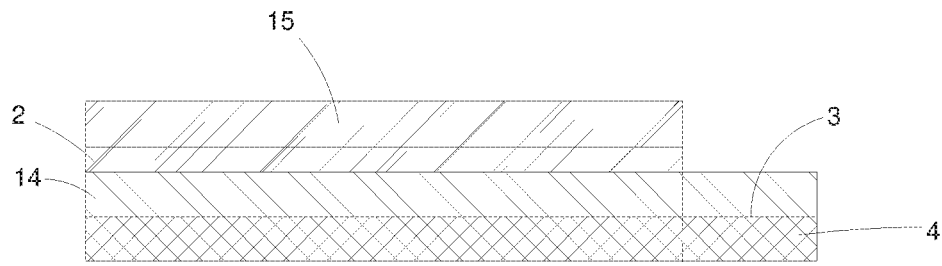
FIG. 2C is a schematic view of a glass substrate after stripping of embodiment 2 of the present disclosure.
Figure 2D:
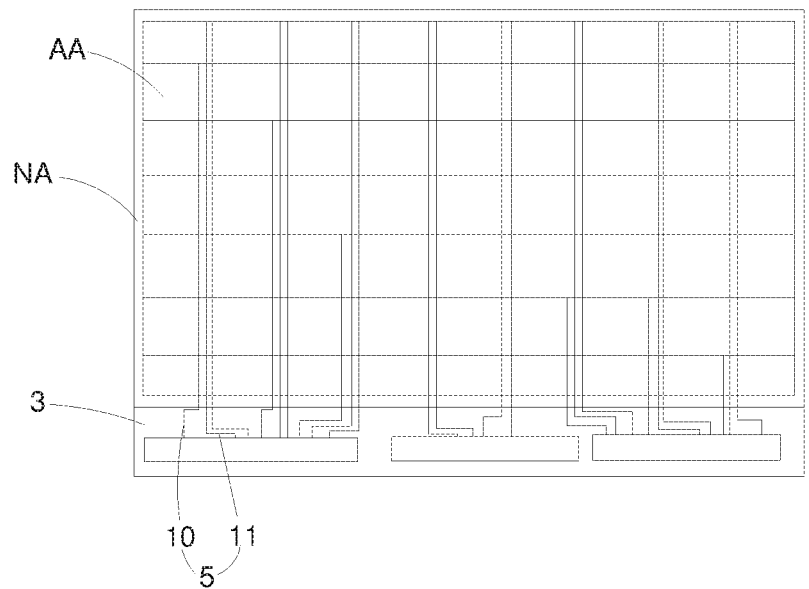
FIG. 2D is an extended schematic view of embodiment 2 of the present disclosure.

As shown in FIGS. 2A, 2B, 2C and 2D, in the display panel of embodiment 2 of the present disclosure, during the manufacturing, the glass substrate 6 has the same area as that of the flexible substrate 4, the flexible substrate 4 includes the display region, the packaging region and the bending region 3, the bending region 3 is disposed outside the packaging region at the lower side of the flexible substrate 4 and extends outside the packaging region, the row metal wires 10 and the column metal wires 11 are both disposed on the lower bending region 3, the row metal wires 10 connect the scanning line 8 of the array substrate 1 to the row driving chip and the column metal wires 11 connect the data line 9 of the array substrate 1 to the column driving chip; a cover plate or film 15 is disposed on the display surface of the display panel on the display region and the packaging region of the display panel, for protection; and after the display panel is completely manufactured, the glass substrate 6 is completely stripped off the flexible substrate 4 by laser stripping (as shown in FIG. 2B), after the glass substrate 6 is stripped off (as shown in FIG. 2C), the bending region 3 is bent, so that the bending region 3 is bent toward a side surface of the flexible substrate 4 deviating from the scanning line 8 and is finally bonded to the side surface of the flexible substrate 4 deviating from the scanning line 8.

Figure 3A:
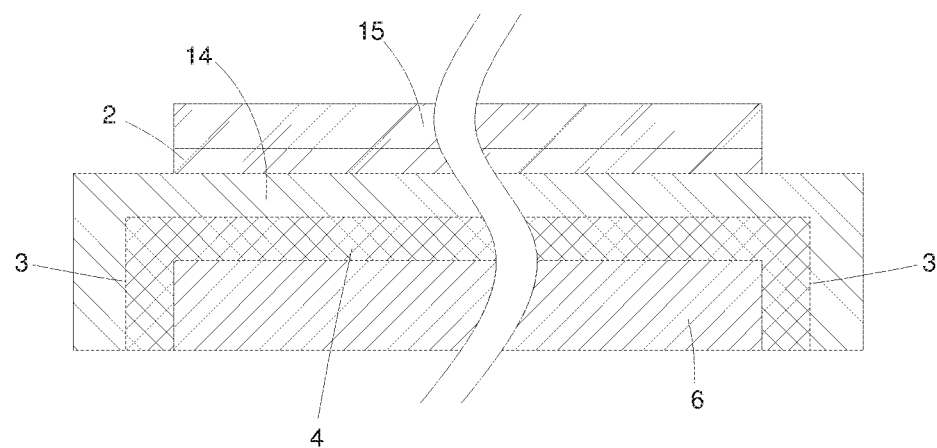
FIG. 3A is a schematic view of a bended structure of embodiment 3 of the present disclosure.
Figure 3B:
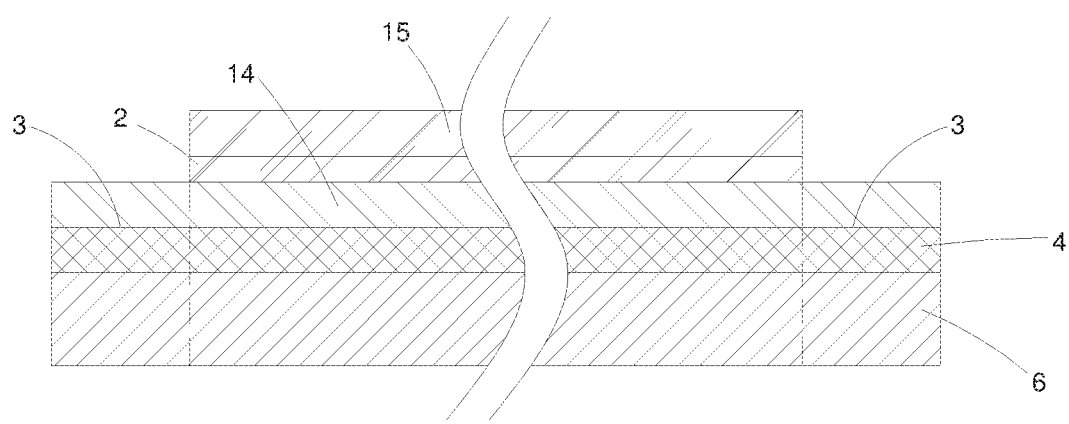
FIG. 3B is a schematic view of a glass substrate before cutting of embodiment 3 of the present disclosure.
Figure 3C:
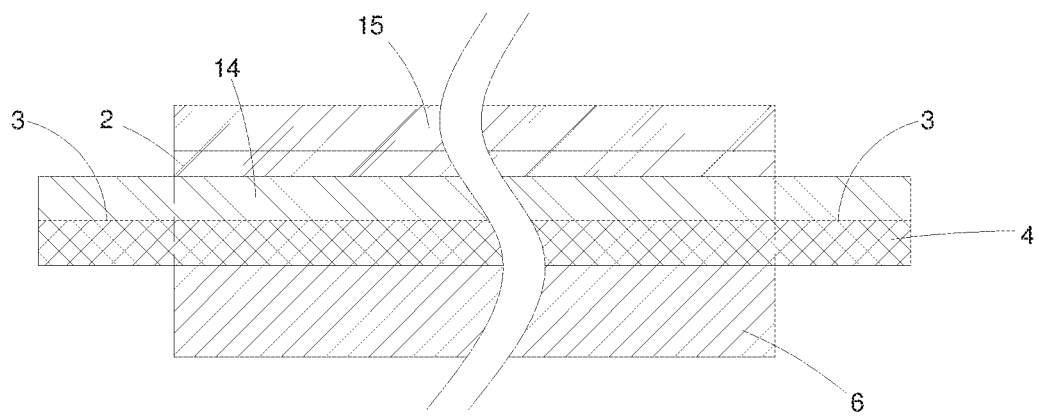
FIG. 3C is a schematic view of a glass substrate after cutting of embodiment 3 of the present disclosure.
Figure 3D:
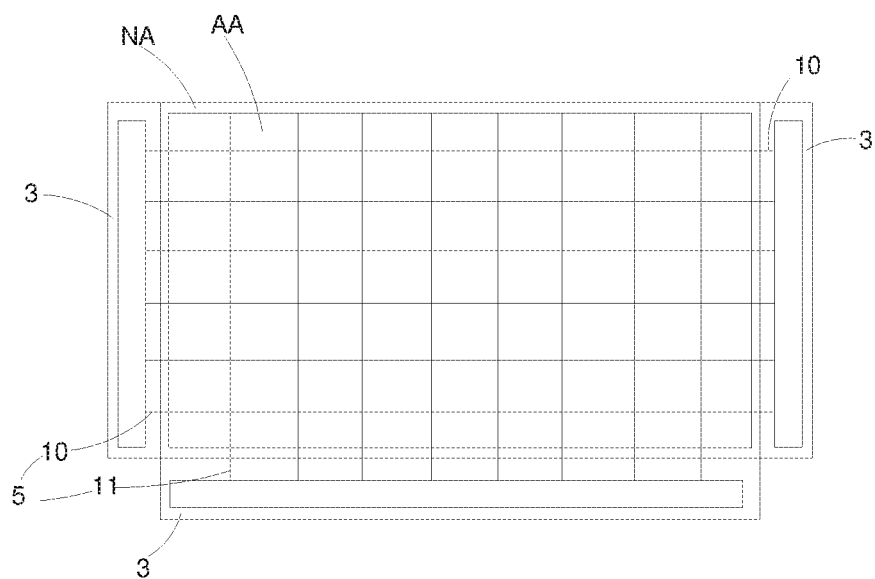
FIG. 3D is an extended schematic view of embodiment 3 of the present disclosure.

As shown in FIGS. 3A, 3B, 3C and 3D, in the display panel of embodiment 3 of the present disclosure, during the manufacturing, the glass substrate 6 has the same area as that of the flexible substrate 4, the flexible substrate 4 includes the display region and the packaging region, bending region 3 extending outside the packaging region is disposed outside the packaging region at the left and right sides and the lower side of the flexible substrate 4, the row metal wires 10 are disposed on the bending region 3 on left and right sides of the flexible substrate 4 and used for connecting the scanning line 8 of the array substrate 1 to the row driving chip, and the column metal wires 11 are disposed on the bending region 3 on the lower side of the flexible substrate 4 and used for connecting the data line 9 of the array substrate 1 to the column driving chip; a cover plate or film 15 is disposed on the display surface of the display panel on the display region and the packaging region of the display panel, for protection; and after the display panel is completely manufactured, the part of glass substrate in the bending region 3 and two corners of the packaging region on the glass substrate 6 is cut by laser (as shown in FIG. 3B), then after the glass substrate in the bending region 3 is cut by laser (as shown in FIG. 3C), the bending region 3 is bent, so that the bending region 3 is bent toward a side surface of the flexible substrate 4 deviating from the scanning line 8 and is finally bonded to a corresponding side of the glass substrate 6.

Figure 4A:
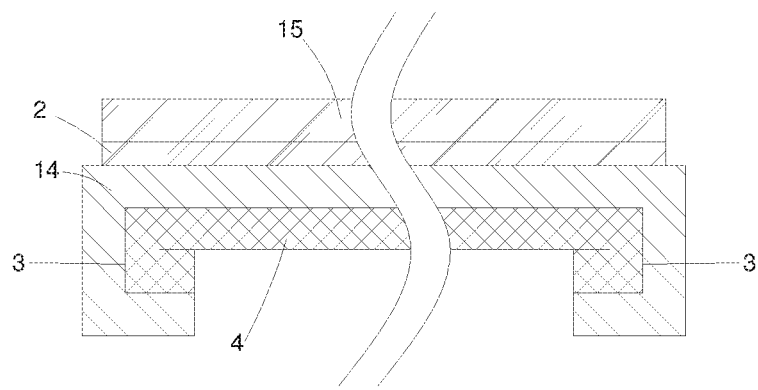
FIG. 4A is a schematic view of a bended structure of embodiment 4 of the present disclosure.
Figure 4B:
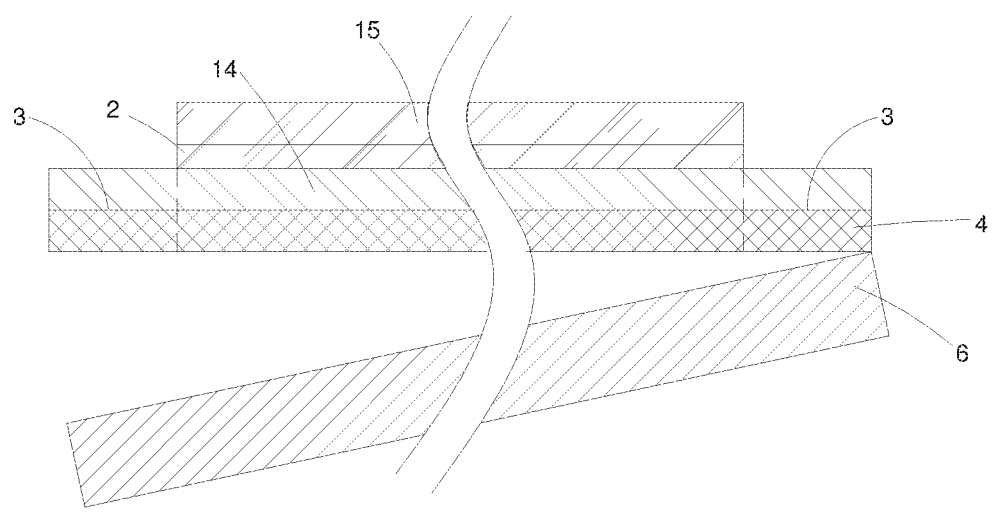
FIG. 4B is a schematic view of a glass substrate before stripping of embodiment 4 of the present disclosure.
Figure 4C:
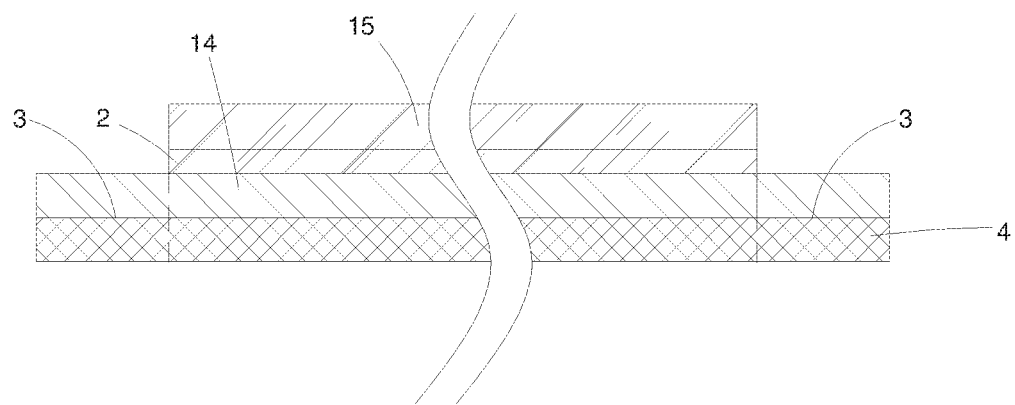
FIG. 4C is a schematic view of a glass substrate after stripping of embodiment 4 of the present disclosure.
Figure 4D:
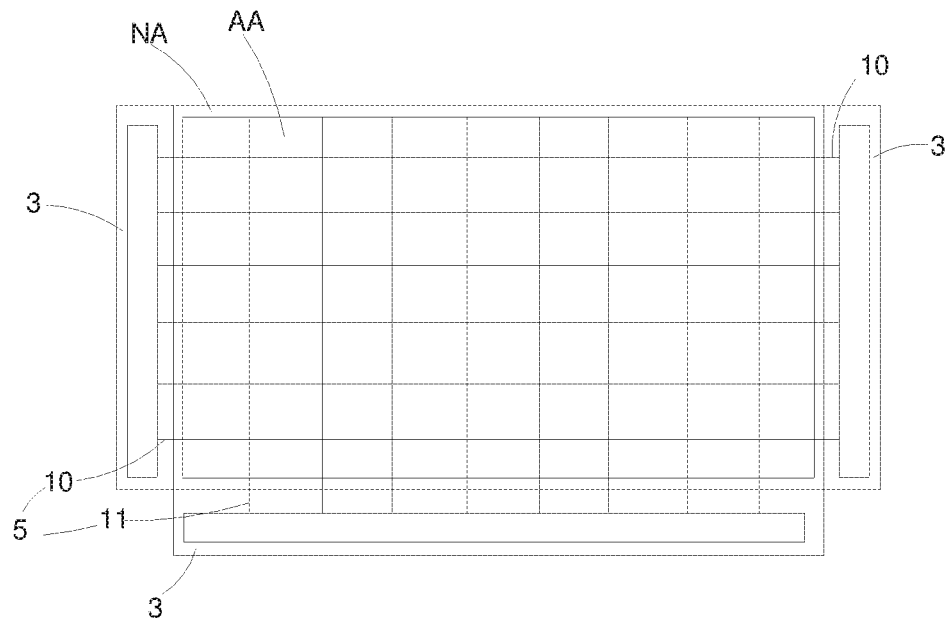
FIG. 4D is an extended schematic view of embodiment 4 of the present disclosure.

As shown in FIGS. 4A, 4B, 4C and 4D, in the display panel of embodiment 4 of the present disclosure, during the manufacturing, the glass substrate 6 has the same area as that of the flexible substrate 4, the flexible substrate 4 includes the display region and the packaging region, bending region 3 extending outside the packaging region is disposed outside the packaging region ate the left and right sides and the lower side of the flexible substrate 4, the row metal wires 10 are disposed on the bending region 3 on left and right sides of the flexible substrate 4 and used for connecting the scanning line 8 of the array substrate 1 to the row driving chip, and the column metal wires 11 are disposed on the bending region 3 on the lower side of the flexible substrate 4 and used for connecting the data line 9 of the array substrate 1 to the column driving chip; a cover plate or film 15 is disposed on the display surface of the display panel on the display region and the packaging region of the display panel, for protection; and after the display panel is completely manufactured, the glass substrate 6 is stripped off the flexible substrate 4 by laser stripping (as shown in FIG. 4B), after the glass substrate 6 is completely stripped off the flexible substrate 4 (as shown in FIG. 4C), the bending region 3 is bent, so that the bending region 3 is bent toward a side surface of the flexible substrate 4 deviating from the scanning line 8 and is finally bonded to the side surface of the flexible substrate 4 deviating from the scanning line 8.

Although the present disclosure has been described with reference to specific exemplary embodiments, those skilled in the art will understand that various changes in form and details may be made therein without departing from the spirit and scope of the disclosure as defined by the appended claims and its equivalents.

What is claimed is:

1. A display panel having a display region and a packaging region disposed outside the display region, comprising:
    an array substrate including a glass substrate having top and bottom surfaces and at least a side surface, a flexible substrate disposed on the top surface of the glass substrate, and a scanning line and a data line disposed on the flexible substrate, wherein a bending region extending outside the packaging region is disposed outside the packaging region at at least one side of the flexible substrate, a metal wire array for connecting the scanning line and the data line of the array substrate with row driving and column driving chips is disposed in the bending region on the flexible substrate, and the bending region is bent toward the side surface of the glass substrate and bonded to the side surface of the glass substrate,
    wherein the glass substrate is selectively cut by laser cutting between the bending region and the packaging region, and a part of the glass substrate in the bending region is stripped off the flexible substrate after being cut by the laser cutting, so that the bending region is bent toward the side surface of the glass substrate and is bonded to the side surface of the glass substrate.

2. The display panel of claim 1, wherein: the metal wire array comprises row metal wires connecting the scanning line of the array substrate to the row driving chip and column metal wires connecting the data line of the array substrate to the column driving chip.

3. The display panel of claim 2, wherein: the bending region extending outside the packaging region is further disposed outside the packaging region at a lower side of the flexible substrate.

4. The display panel of claim 2, wherein: the bending region extending outside the packaging region is further disposed outside left and right sides and the lower side of the packaging region of the flexible substrate, the metal wire array connects the scanning line of the array substrate with the row driving chip on the bending region at the left and right sides of the flexible substrate, and connects the data line of the array substrate with the column driving chip on the bending region at the lower side of the flexible substrate.

5. The display panel of claim 1, wherein: the array substrate further comprises a flexible buffer layer disposed on the flexible substrate and covering the metal wires, and the scanning line and the data line are disposed on the flexible buffer layer.

6. The display panel of claim 5, wherein: the row metal wires and the column metal wires are disposed on a same layer.

7. The display panel of claim 6, wherein: the bending region extending outside the packaging region is further disposed outside the packaging region at a lower side of the flexible substrate.

8. The display panel of claim 6, wherein: the bending region extending outside the packaging region is further disposed outside left and right sides and the lower side of the packaging region of the flexible substrate, the metal wire array connects the scanning line of the array substrate with the row driving chip on the bending region at the left and right sides of the flexible substrate, and connects the data line of the array substrate with the column driving chip on the bending region at the lower side of the flexible substrate.

9. The display panel of claim 5, wherein: the bending region extending outside the packaging region is further disposed outside the packaging region at a lower side of the flexible substrate.

10. The display panel of claim 5, wherein: the bending region extending outside the packaging region is further disposed outside left and right sides and the lower side of the packaging region of the flexible substrate, the metal wire array connects the scanning line of the array substrate with the row driving chip on the bending region at the left and right sides of the flexible substrate, and connects the data line of the array substrate with the column driving chip on the bending region at the lower side of the flexible substrate.

11. The display panel of claim 1, wherein: the bending region extending outside the packaging region is further disposed outside the packaging region at a lower side of the flexible substrate.

12. The display panel of claim 1, wherein: the bending region extending outside the packaging region is further disposed outside left and right sides and the lower side of the packaging region of the flexible substrate, the metal wire array connects the scanning line of the array substrate with the row driving chip on the bending region at the left and right sides of the flexible substrate, and connects the data line of the array substrate with the column driving chip on the bending region at the lower side of the flexible substrate.

13. The display panel of claim 1, further comprising a color filter substrate disposed opposite to the array substrate.

14. A display panel having a display region and a packaging region disposed outside the display region, comprising:
    an array substrate including a glass substrate having top and bottom surfaces and at least a side surface, a flexible substrate disposed on the top surface of the glass substrate, and a scanning line and a data line disposed on the flexible substrate, wherein a bending region extending outside the packaging region is disposed outside the packaging region at at least one side of the flexible substrate, a metal wire array for connecting the scanning line and the data line of the array substrate with row driving and column driving chips is disposed in the bending region on the flexible substrate, and the bending region is bent toward the side surface of the glass substrate and bonded to the side surface of the glass substrate, wherein the glass substrate is completely stripped off the flexible substrate by laser stripping, so that the bending region is bent toward the side surface of the glass substrate and is bonded to the side surface of the glass substrate.

15. The display panel of claim 14, wherein the metal wire array comprises row metal wires connecting the scanning line of the array substrate to the row driving chip and column metal wires connecting the data line of the array substrate to the column driving chip.

16. The display panel of claim 14, wherein the array substrate further comprises a flexible buffer layer disposed on the flexible substrate and covering the metal wires, and the scanning line and the data line are disposed on the flexible buffer layer.

17. The display panel of claim 16, wherein the row metal wires and the column metal wires are disposed on a same layer.

18. The display panel of claim 14, wherein the bending region extending outside the packaging region is further disposed outside the packaging region at a lower side of the flexible substrate.

19. The display panel of claim 14, wherein the bending region extending outside the packaging region is further disposed outside left and right sides and the lower side of the packaging region of the flexible substrate, the metal wire array connects the scanning line of the array substrate with the row driving chip on the bending region at the left and right sides of the flexible substrate, and connects the data line of the array substrate with the column driving chip on the bending region at the lower side of the flexible substrate.

20. The display panel of claim 14, further comprising a color filter substrate disposed opposite to the array substrate.

* * * * *